United States Patent
Yang et al.

(10) Patent No.: US 6,559,004 B1
(45) Date of Patent: May 6, 2003

(54) METHOD FOR FORMING THREE DIMENSIONAL SEMICONDUCTOR STRUCTURE AND THREE DIMENSIONAL CAPACITOR

(75) Inventors: Gwo-Shii Yang, Hsin-Chu (TW); Hsueh-Chung Chen, Taipei (TW); Chiung-Sheng Hsiung, Hsin-Chu (TW); Tong-Yu Chen, Hsin-Chu (TW); Sung-Hsiung Wang, Kaohsiung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/011,760

(22) Filed: Dec. 11, 2001

(51) Int. Cl.$^7$ .............................................. H01L 21/336
(52) U.S. Cl. ...................... 438/253; 438/258
(58) Field of Search ................... 438/250–251, 438/253–256, 393–394, 396–399

(56) References Cited

U.S. PATENT DOCUMENTS 6,331,471 B1 * 12/2001 Lee et al. .................... 438/396

* cited by examiner

*Primary Examiner*—David Nelms
*Assistant Examiner*—Dung A Le

(57) ABSTRACT

A method for forming a three dimensional semiconductor structure which has vertical capacitor(s) but not horizontal capacitor(s). The method essentially at least includes these steps of forming bottom plates within dielectric layers, forming another dielectric layer over bottom plates, removing all dielectric layers over bottom plates, forming optional liner(s) and capacitor dielectric layers on bottom plates, and forming top plates over capacitor dielectric layers. Note that shape of bottom plates is alike to the bottom connection and verticle fingers, also note that each gap within bottom plates is filled by both capacitor dielectric layer and top plate.

15 Claims, 8 Drawing Sheets

METHOD FOR FORMING THREE DIMENSIONAL SEMICONDUCTOR STRUCTURE AND THREE DIMENSIONAL CAPACITOR

BACKGROUND OF THE INVENTION

1. Field of the Invention

This invention relates generally to the method for forming three dimensional structure, such as three dimensional MINCAP (minimized capacitor) structure, and also relates to the method for forming the three dimensional capacitor.

2. Description of the Prior Art

Structures of some contemporary semiconductor devices are more complex than the combination of multilevel interconnections and elements, such as transistor, in and on the substrate. As usual, these semiconductor devices have at least one element that is disposed over substrate and directly contacted with interconnections. For example, the MINCAP has a capacitor whose plates are contacted with a metal structure, such as metal lines, and an overlying metal structure separately.

One popular conventional structure of these semiconductor devices is shown in FIG. 1A. As FIG. 1A shows, first dielectric layer 11 is disposed on substrate 10, metal structure 12, which is one level of the multilevel interconnections, is disposed at the top of the surface of first dielectric layer 11, and second dielectric layer 13 is disposed on first dielectric layer 11. Bottom plate 14, third dielectric layer 15, and top plate 16 forms the capacitor which is disposed over first dielectric layer 11 and within second dielectric layer 13. Second metal structures 17, which are another level of the multilevel interconnections, are essentially disposed over second dielectric layer 13. Moreover, second metal structures 17 also pierce through second dielectric layer 13 and are contacted with both first metal structure 12 and bottom plate 14. In addition, possible cap layer(s), possible etch stop layer(s), and possible liner(s) are all omitted to simplify FIG. 1A.

Clearly, this structure is easy to be formed for each part could be formed by conventional lithography and etch process. However, this structure can not avoid following disadvantage: First, because bottom plate 14 must be insulated from top plate 16, three masks are require to form bottom plate 14, third dielectric layer 15, and top plate 16 separately. Second, large topography leads to difficulty in sequent lithography process(es) and etch process(es). Third, owing to area of both plates 14/16 is increased to increase capacitance of capacitor, occupied area of capacitor is large and then available packaged density of this structure is limited.

Another popular conventional structure of these semiconductor devices is shown in FIG. 1B. As FIG. 1B shows, first dielectric layer 11 is disposed over substrate 10 and first metal structure 12 is disposed at the top of the surface of first dielectric layer 11. Third dielectric layer 15 and top plate 16 are disposed over first metal structure 12 in sequence while first metal structure 12 playing the role of bottom plate 14. Second metal structure 17 which are another level of the multilevel interconnections, are essentially disposed over second dielectric layer 13. Moreover, second metal structures 17 also pierce through second dielectric layer 13 and are contacted with both first metal structure 12 and top plate 16. In addition, possible cap layer(s), possible etch stop layer(s), and possible liner(s) are all omitted to simplify FIG. 1B.

Clearly, this structure can reduced required mask for top plate 16 and third dielectric layer 15 being formed by the same mask and no mask being required to form non-existent bottom plate 14. However, this structure can not avoid following disadvantages: First, even capacitor and first metal structure 12 is overlapped, occupied area still is limited by the tendency of increasing plate area to increase capacitance. Second, topography causes problem on coating process if spin-on low-k dielectric material. Third, top plate 16 is difficult to be patterned for weak alignment signal resulted from highly reflective top plate metal and smooth post planarized surface. Fourth, reliability concerns due to possible roughness of first metal structure 12.

Accordingly, current fabrications of popular structures of all contemporary semiconductor devices which have capacitor within multilevel interconnections are not prefect. Thus, further improvement is required to let fabrication of these devices, such as MINCAP, be more effective, more large alignment tolerance, more easy to be product, and more easy to be with damascene process.

SUMMARY OF THE INVENTION

According to previous defects of conventional technology, one main object of this invention is to provide a method for forming the three dimensional semiconductor structure which replaces horizontal plates of capacitor by vertical plates.

Further, another main object of this invention is to provide methods for forming two possible structures of capacitor.

This invention provides a method for forming a three dimensional semiconductor structure which has vertical capacitor(s) but not horizontal capacitor(s). The method essentially at least includes these steps of forming bottom plates within dielectric layers, forming another dielectric layer over bottom plates, removing all dielectric layers over bottom plates, forming optional liner(s) and capacitor dielectric layers on bottom plates, and forming top plates over capacitor dielectric layers. Note that shape of bottom plates is alike to the bottom connection and verticle fingers, also note that each gap within bottom plates is filled by both capacitor dielectric layer and top plate.

The invention also provides methods for forming two possible capacitor structures. One present method is a method for forming a three dimensional capacitor, essentially at least includes following steps: forming an undulatory bottom plate, forming a dielectric layer on the undulatory bottom plate, and forming an undulatory top plate on the dielectric layer. Another present method is a method for forming a capacitor, at least includes these steps of forming numerous first plates, where first plates are arranged in a sequence and each first plate is separated from others so let numerous gaps be formed, where each gap is disposed between two adjacent first plates; forming numerous second plates so let each said second plate be disposed in one gap, where each second plate is separated from other second plates and first gaps; and forming a dielectric layer within gaps so let each gap be essentially filled by dielectric layer and one second plate.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

One preferred embodiment is a method for forming a three dimensional semiconductor structure, the three dimensional semiconductor structure has a capacitor and a multi-level interconnection. Essential steps of this present method are present as follows.

Figure 1A:
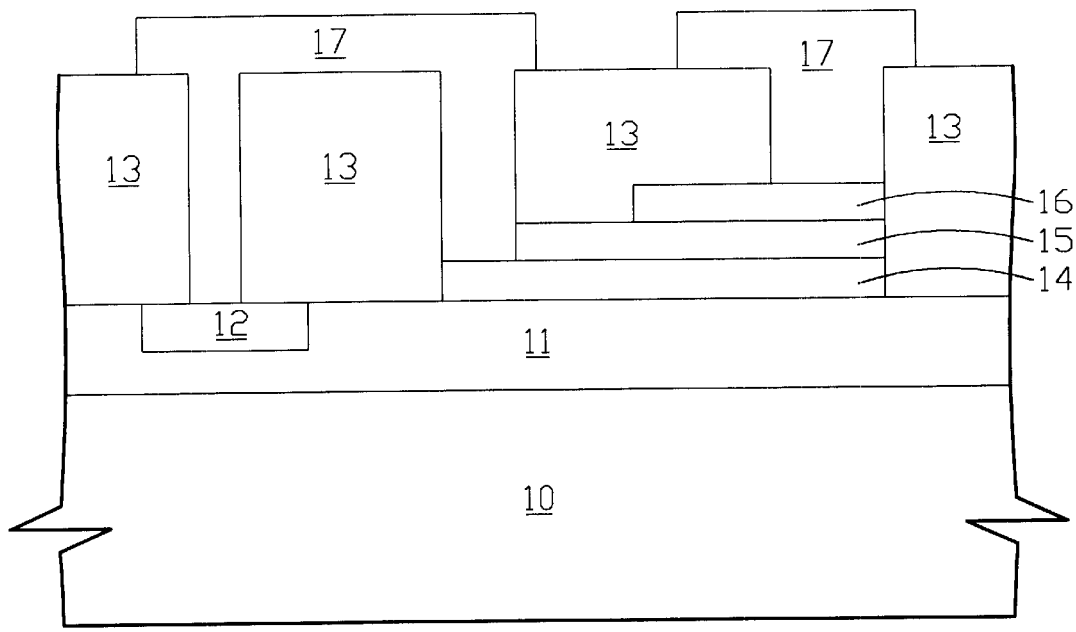
FIG. 1A and FIG. 1B show two popular conventional structure of semiconductor device which has a capacitor within the multilevel interconnections, such as MINCAP.
Figure 1B:
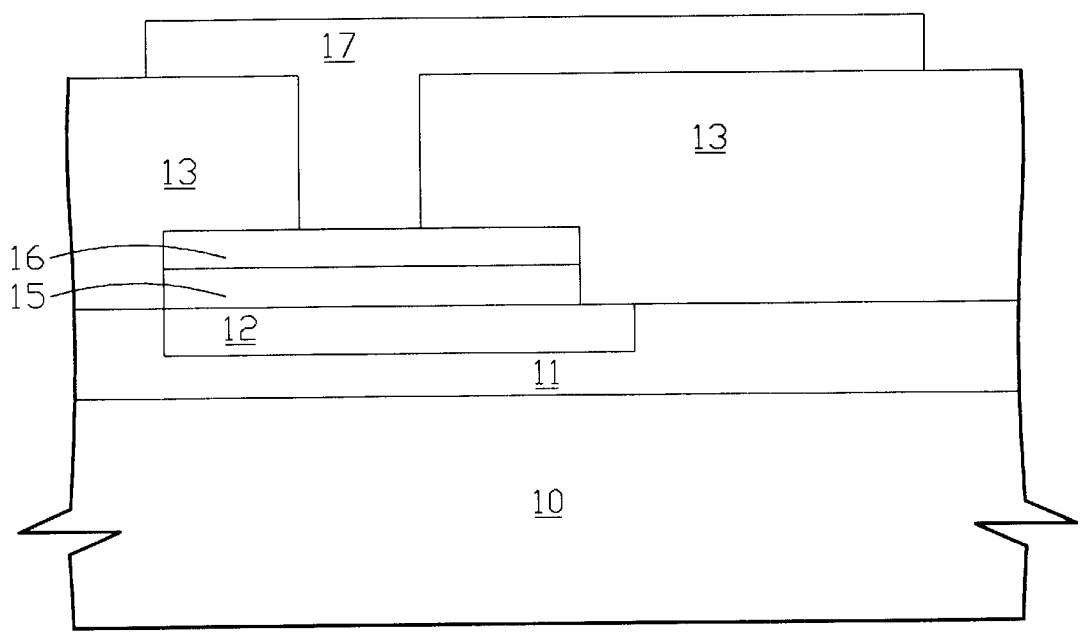
Figure 2A:
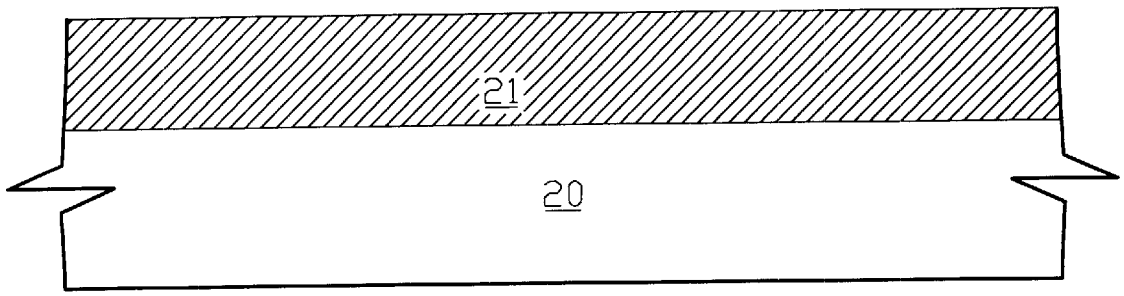
FIG. 2A through FIG. 2J are some cross-sectional illustrations of some essential steps of one preferred embodiment of this invention.

Initially, as FIG. 2A shows, provide substrate 20 which is covered by first dielectric layer 21.

Figure 2B:
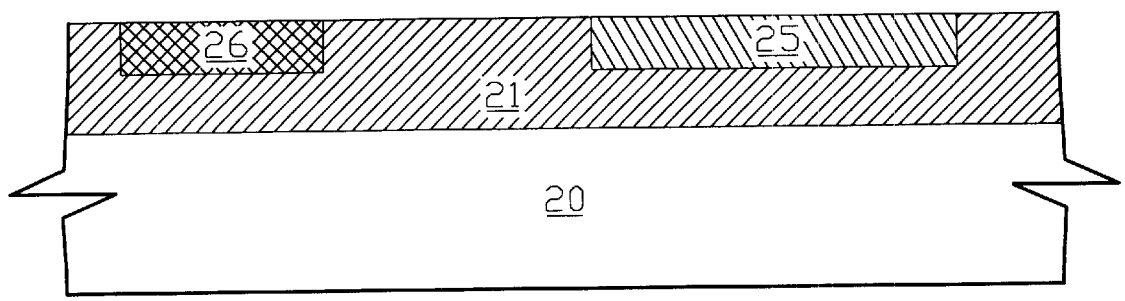

Then, as FIG. 2B shows, form first metal structure 25 and second metal structure 26 at the top of the surface within first dielectric layer 21. Herein, second metal structure 26 is separated from first metal structure 25.

Moreover, an optional step is planarizing the surface of first dielectric layer 21 before both said first metal structure 25 and second metal structure 26 are formed. Besides, consider the geometry relation between first dielectric layer 21 and both first metal structure 25 and second metal structure 26, reasonably, both first metal structure 21 and second metal structure 22 could be disposed within first dielectric layer 21 by the application of the damascene process, or even the dual damascene process.

Figure 2C:
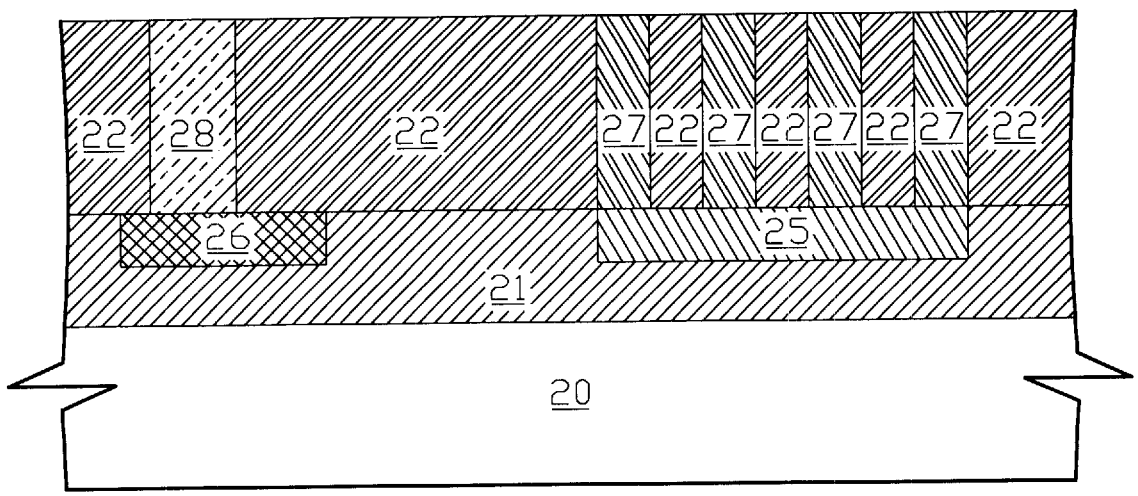

Next, as FIG. 2C shows, form second dielectric layer 22, third metal structures 27, and fourth metal structure 28 over first dielectric layer 21. Herein third metal structures 27 are horizontal arranged over first metal structure 21 and disposed at the top of the surface within second dielectric layer 22, and each third metal structure 27 is separated from others so let numerous gaps be formed and filled by second dielectric layer 22. Moreover, fourth metal structure 28 is disposed over second metal structure 26 and disposed at the top of the surface within second dielectric layer 22.

Clearly, the surface of first dielectric layer 21 is smooth and nothing is located on the surface before second dielectric layer 22 is formed. Thus, it is easy to form second dielectric layer 22 over the entire surface, no mater second dielectric layer 22 is formed by deposition or SOG (spin on glass).

In addition, second dielectric layer 22 could be disposed over the surface of first dielectric layer 21 before both third metal structures 27 and fourth metal structure 28 are formed. In that case, both third metal structures 27 and fourth metal structure 28 could be formed by application of the damascene process, or the dual damascene process.

Figure 2D:
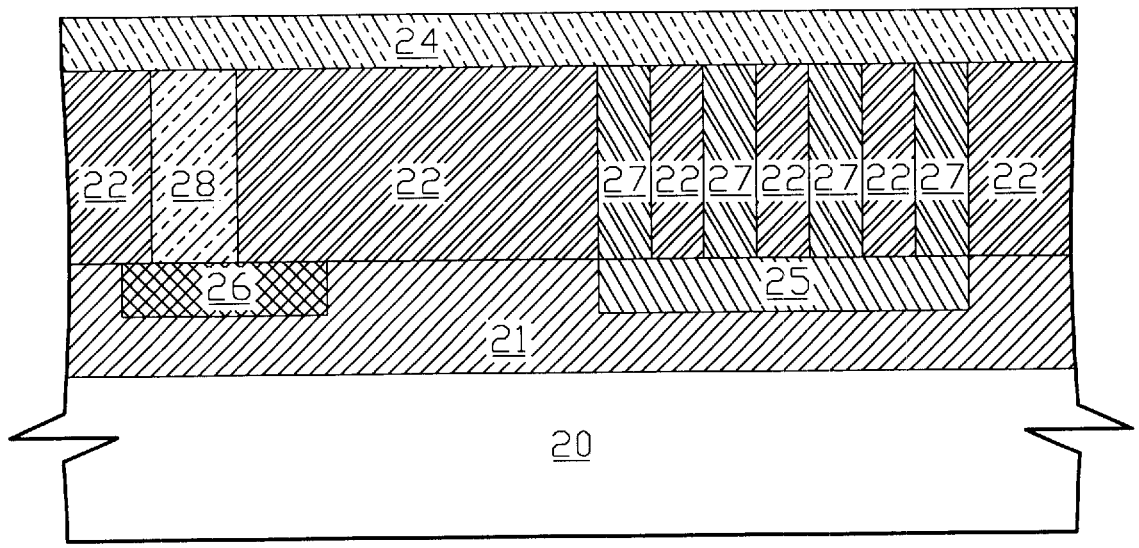

Sequentially, as FIG. 2D shows, form fourth dielectric layer 24 over second dielectric layer 22, third metal structures 27, and fourth metal structure 28.

Again, an optional step is planarizing the surface of second dielectric layer 22 before both third metal structures 27 and fourth metal structure 28 are formed. One advantage is that fourth dielectric layer 24 is easy to be formed, no mater fourth dielectric layer 24 is formed by deposition or SOG (spin on glass).

Figure 2E:
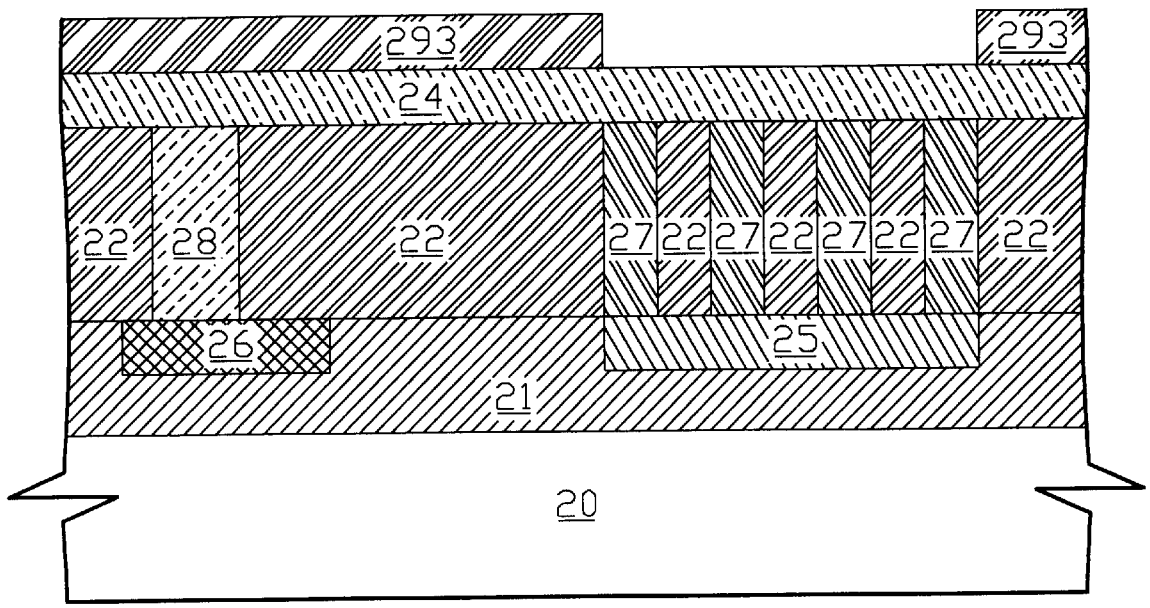

And then, As FIG. 2E shows, form first mask 293 over fourth dielectric layer 24. Herein, first mask 293 exposes partial fourth dielectric layer 24 which is disposed over both these gaps and part of third metal structures 27 that is disposed between these gaps.

Figure 2F:
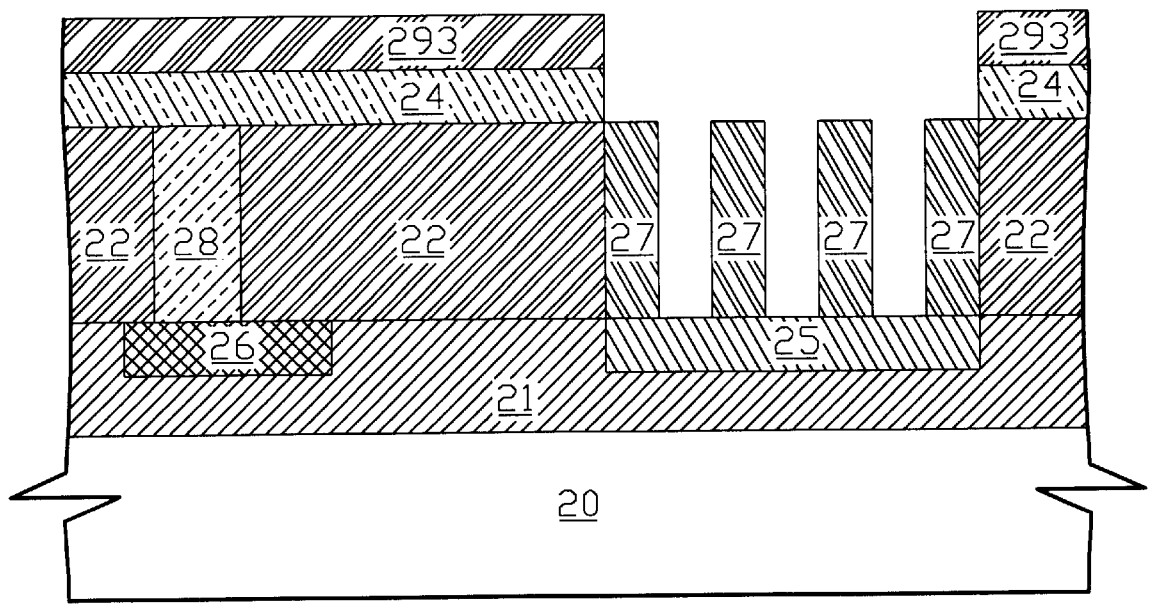

Next, as FIG. 2F shows, remove partial fourth dielectric layer 24 and partial second dielectric layer 22 that are exposed by first mask 293. Obviously, to enlarge allowable alignment tolerance, it is good to let the outside third metal structures 27 be formed wider than other third metal structures 27. Moreover, as usual, both first metal structure 25 and third metal structures 27 are used as the etch stop layer while partially second dielectric layers 22 are removed.

Figure 2G:
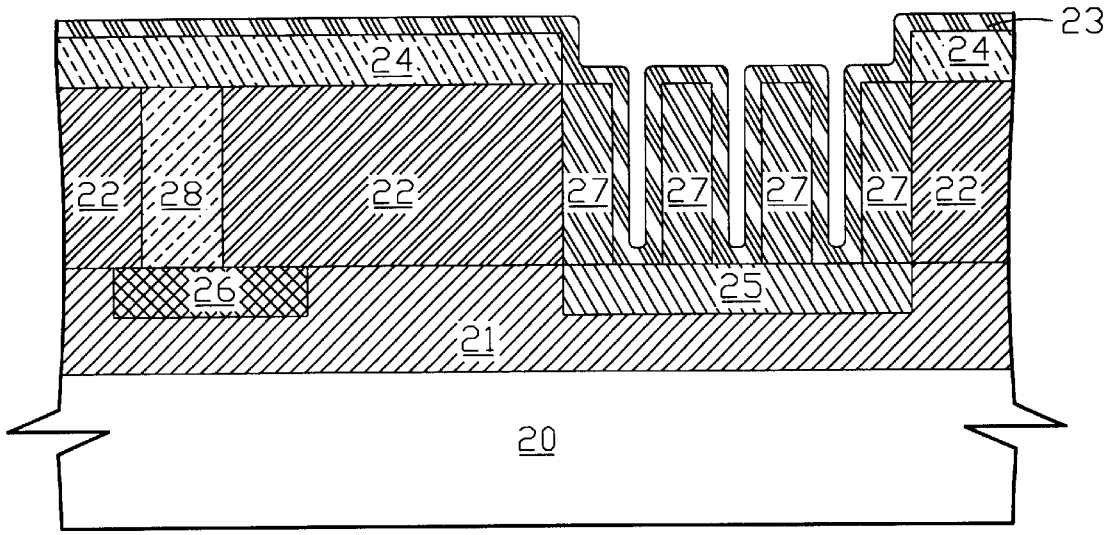

Then, as FIG. 2G shows, remove first mask 293 and then form numerous third dielectric layers 23 over both third metal structures 27 and first metal structure 21. Herein, each gap is partially filled by third dielectric layers 23, and the dielectric constant of third dielectric layers 23 is higher than the dielectric constant of other dielectric layers 21/22/24. For example, possible materials of third dielectric layers 27 at least include oxide, SiN, SiC, Ta2O5, TiO2, Y2O3, and ferroelectric materials.

Figure 2H:
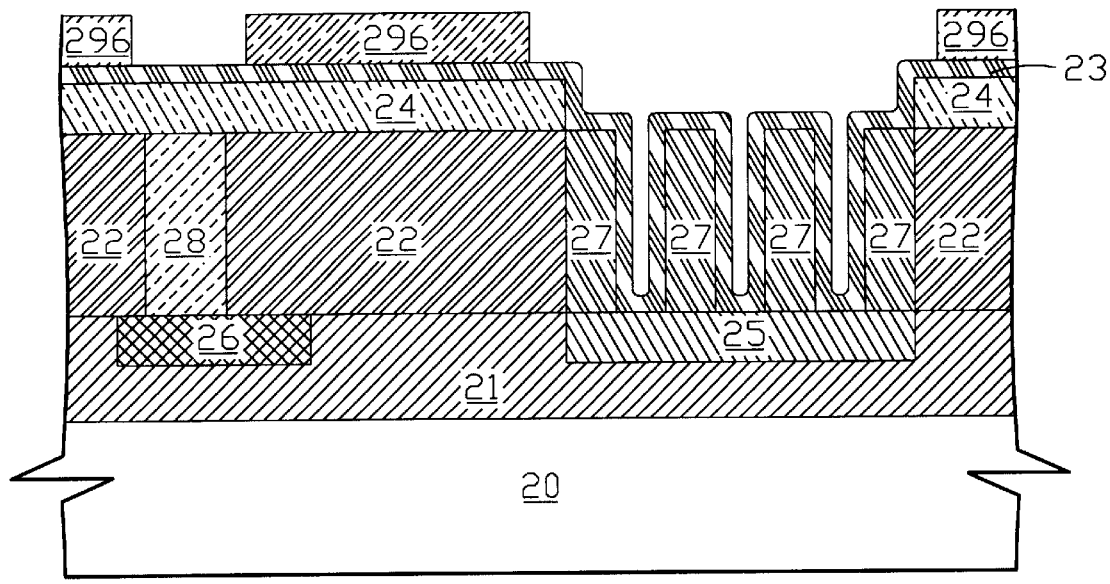

Sequentially, as FIG. 2H shows, form second mask 296 over fourth dielectric layer 24. Herein, second mask 296 exposes partial fourth dielectric layer 24 which is disposed over fourth metal structure 28.

Figure 2I:
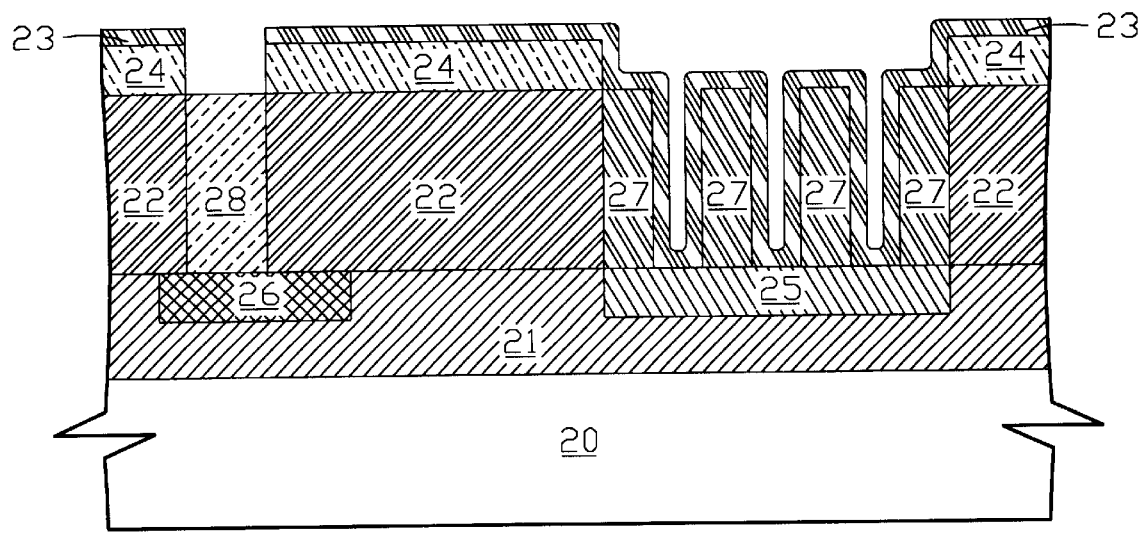

Next, as FIG. 2I shows, remove partial fourth dielectric layer 24 that are exposed by second mask 296, and then remove second mask 296. Herein, partial third dielectric layers 23 which located on fourth dielectric layer 24 also is removed.

Figure 2J:
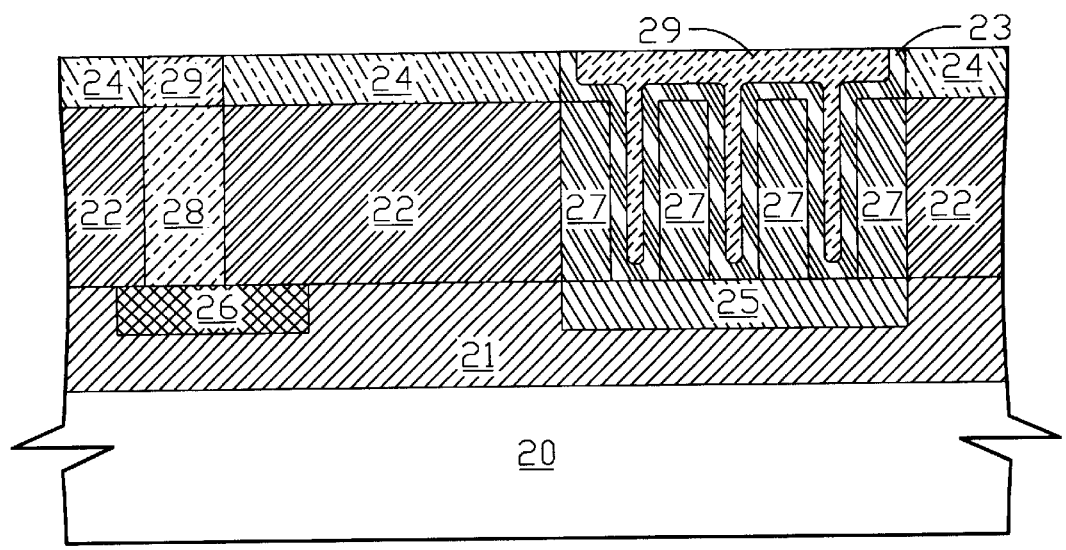

Finally, as FIG. 2J shows, form numerous fifth metal structures 29 within fourth dielectric layer 24 and over both fourth metal structure 28 and third metal structures 27. Herein, fifth metal structures 29 also fill these gaps so let these gaps be totally filled by both third dielectric layers 23 and said fifth metal structures 29.

Clearly, as discussed above, fifth metal structures 29 are formed by the application of the damascene process or the dual damascene process. Further, because that third dielectric layers 23 also could be disposed on the sidewall of fourth dielectric layer 24 while third dielectric layer 23 being disposed into these gaps, third dielectric layers also could be disposed over the sidewall of partial fifth metal structures 29 which is disposed over third metal structures 27.

Furthermore, the embodiment further comprise the optional step of forming a first liner, not shown in all figures, over both third metal structures 27 and first dielectric layer 25 before third dielectric layers 23 are formed. The embodiment also further comprises the optional step of forming a second liner, not shown in all figures, over third dielectric layers 23 before fifth metal structures 25 are formed. Herein, possible materials of these liners could be TiN, TaN, WN, and any material which is used to form liner in conventional semiconductor fabrication.

Clearly, both second metal structure 26 and four metal structure 28 only corresponds to the connection(s) and the interconnection(s). On the other hand, first metal structure 25, third metal structures 27, third dielectric layers 23, and partial fifth metal structures 29 form a capacitor. Moreover, although fabrication of connection(s)/interconnections(s) and fabrication of capacitor could be incorporated as discussed above, two fabrications also could be separate and individually performed.

Thus, another preferred embodiment of this invention is a method for forming a MINCAP, this embodiment at least includes following steps in sequence:

(1) Provide a substrate which is covered by a first dielectric layer.

(2) Form a first metal structure at the top of the surface within the first dielectric layer.

(3) Forming a second dielectric layer and numerous third metal structures over the substrate. Herein the third metal structures are horizontal arranged over the first metal structure and disposed at the top of the surface within the second dielectric layer, each third metal structure is separated from others so let numerous gaps be formed and filled by the second dielectric layer.

(4) Form a fourth dielectric layer over the second dielectric layer and these third metal structures.

(5) Form a mask over the fourth dielectric layer. The mask exposes partial fourth dielectric layer which is disposed over both gaps and part of third metal structures that are disposed between neighboring gaps.

(6) Remove partial fourth dielectric layer and partial second dielectric layer that are exposed by the mask, and then remove the mask.

(7) Form numerous third dielectric layers over both these third metal structures and the first metal structure. Herein, each gap is partially filled by these third dielectric layers, and the dielectric constant of the third dielectric layers being higher than the dielectric constant of other dielectric layers.

(8) Form a fifth metal structures within the fourth dielectric layer and over these third metal structures. Herein, fifth metal structures also fills these gaps so let these gaps be totally filled by both these third dielectric layers and the fifth metal structures.

Figure 3A:
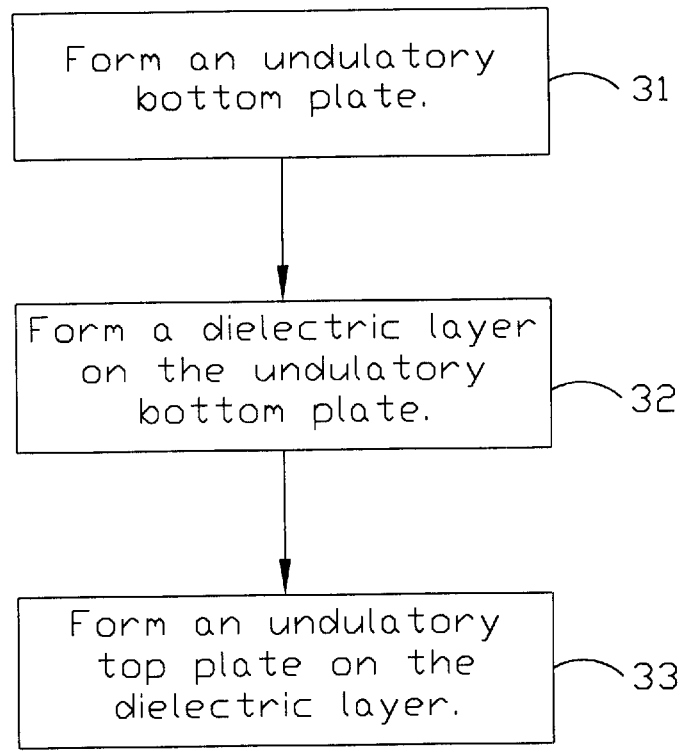
FIG. 3A through FIG. 3B show some cross-sectional illustrations of some essential steps and a possible amendment of another preferred embodiment of this invention.

The invention further has the preferred embodiment which is a method for forming a three dimensional capacitor. As FIG. 3A shows, al least has following essential steps:

As bottom plate block 31 shows, form an undulatory bottom plate.

As dielectric layer block 32 shows, form a dielectric layer on the undulatory bottom plate.

As top plate block 33 shows, form an undulatory top plate on the dielectric layer.

Figure 3B:
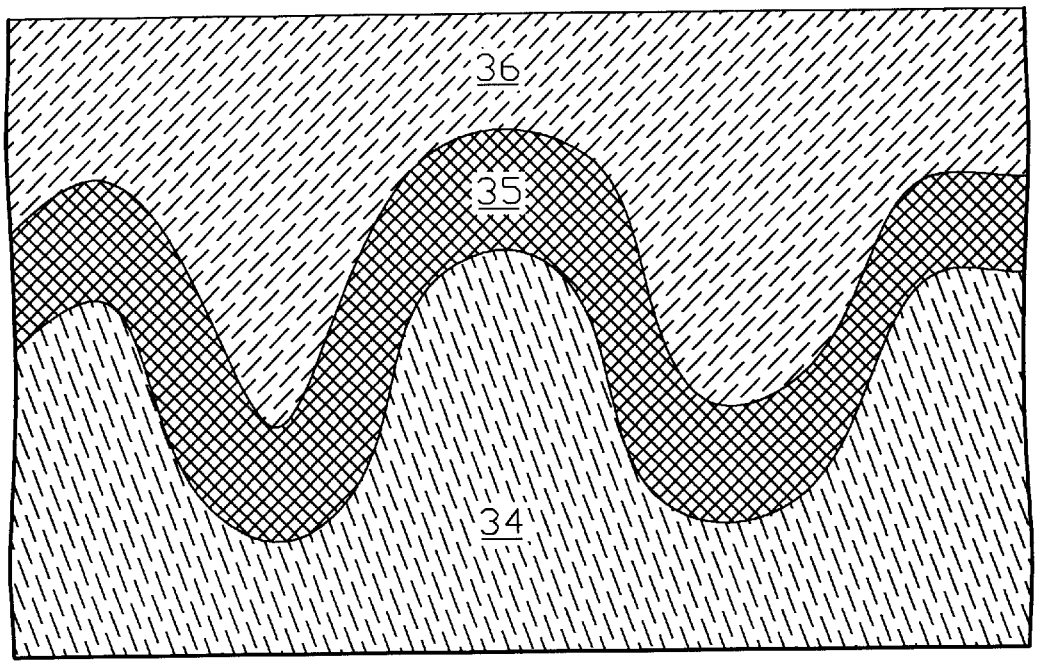

Clearly, one important characteristic of this embodiment is that the surfaces of both plates are curved, especially the surface facing to the dielectric layer. Thus, total area of plates is enlarged and then capacitance is increased. Moreover, in order to enhance the effect of this characteristic, as FIG. 3B shows, it is better to adjust the topography of both plates 34/36 and to adjust thickness of dielectric layer 35, so let each gap within undulatory bottom plate 34 be totally filled by both dielectric layer 35 and undulatory top plate 36.

Figure 4A:
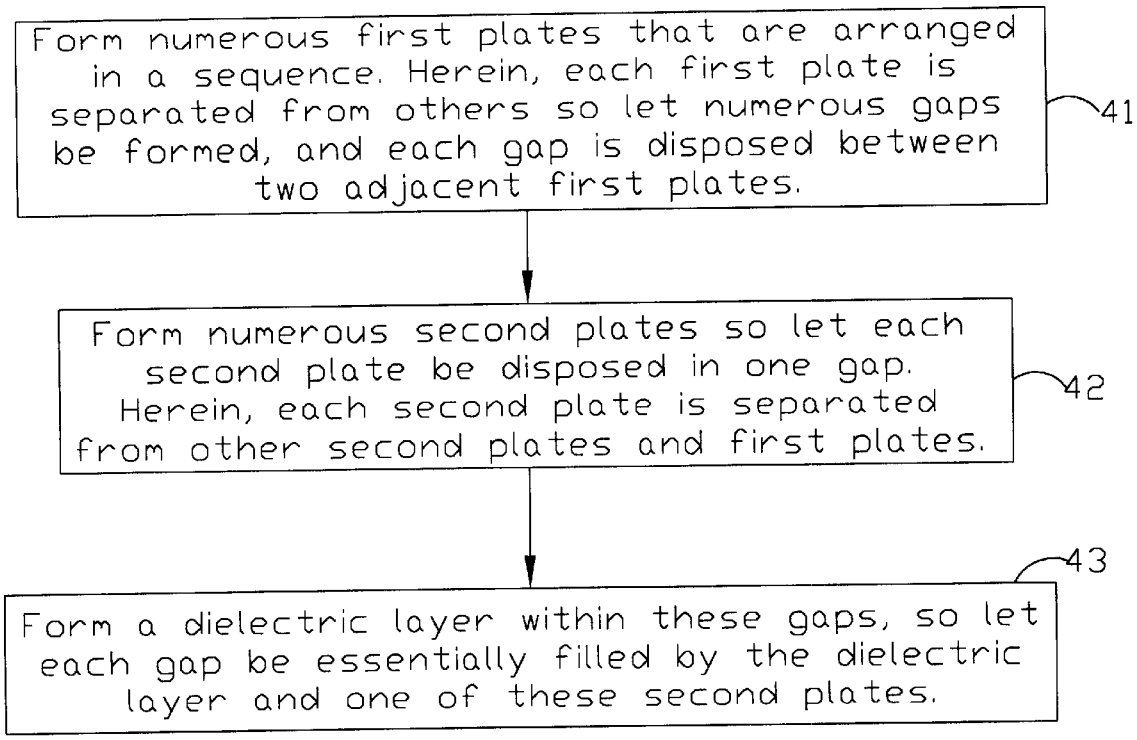
FIG. 4A through FIG. 4B show two possible processes of the other preferred embodiment of this invention.

The invention yet has a preferred embodiment which is a method for forming a capacitor, as FIG. 4A shows, the embodiment at least has following essential steps:

As block 41 shows, form numerous first plates that are arranged in a sequence. Herein, each first plate is separated from others so let numerous gaps be formed, and each gap is disposed between two adjacent first plates.

As block 42 shows, form numerous second plates so let each gap have one of said second plates. Herein, each second plate is separated from other second plates and first plates.

As block 43 shows, form a dielectric layer within these gaps, so let each gap be essentially filled by the dielectric layer and one of these second plates.

Certainly, it is possible to let the dielectric layer only fill part of each gap, it also is possible to let each second plate only partially disposed outside corresponding gap.

Figure 4B:
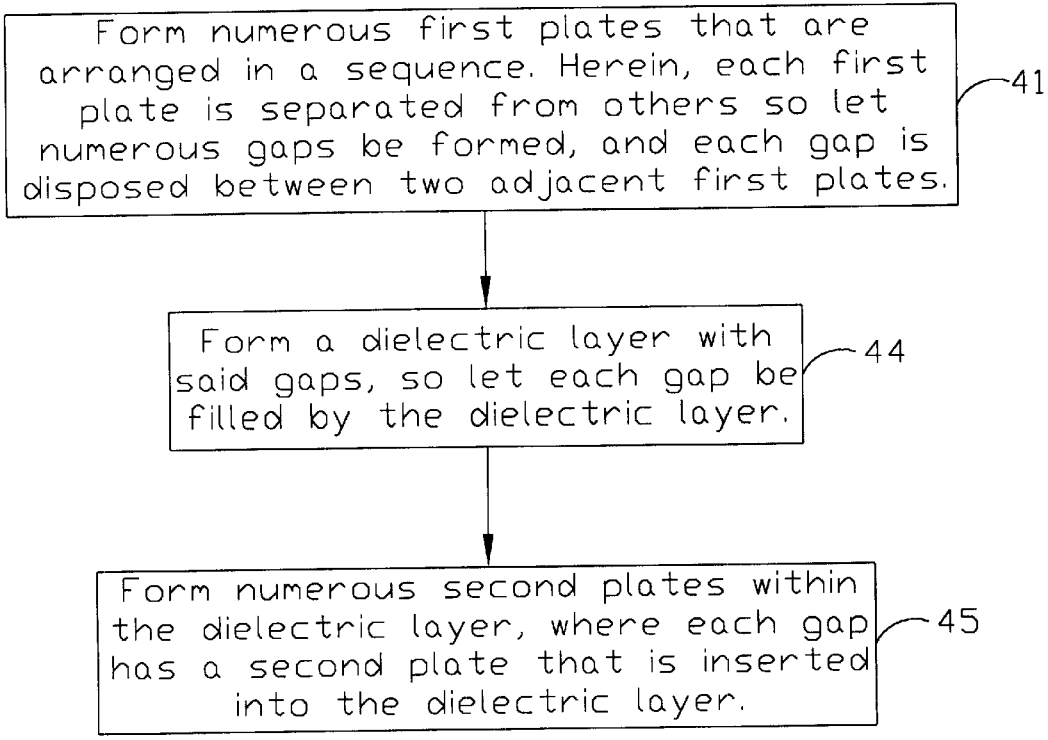

Besides, as FIG. 4B shows, steps of this embodiment also could be following:

As block 41, form numerous first plates that are arranged in a sequence. Herein, each first plate is separated from others so let numerous gaps be formed, and each gap is disposed between two adjacent first plates.

As block 44 shows, form a dielectric layer with these gaps, so let each be filled by the dielectric layer.

As block 45 shows, form numerous second plates within the dielectric layer, where each gap has a second plate that is inserted into the dielectric layer.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A method for forming a three dimensional semiconductor structure, comprising:

providing a substrate, said substrate is covered by a first dielectric layer;

forming a first metal structure and a second metal structure at the top of the surface within said first dielectric layer, said second metal structure being separated from said first metal structure;

forming a second dielectric layer, a plurality of third metal structures, and a fourth metal structure over said substrate, wherein said third metal structures are horizontal arranged over said first metal structure and disposed at the top of the surface within said second dielectric layer, each said third metal structure being separated from others so let a plurality of gaps be formed and filled by said second dielectric layer, wherein said fourth metal structure is disposed over said second metal structure and disposed at the top of the surface within said second dielectric layer;

forming a fourth dielectric layer over said second dielectric layer, said third metal structures, and said fourth metal structure;

forming a first mask over said fourth dielectric layer, said first mask exposing partial said fourth dielectric layer which is disposed over both said gaps and part of said third metal structures that is disposed between said gaps;

removing partial said fourth dielectric layer that are exposed by said first mask and partial said second dielectric layer that located in an on said gaps;

removing said first mask;

forming a plurality of third dielectric layers over both said third metal structures and said first metal structure, wherein each said gap is partially filled by said third dielectric layers, the dielectric constant of said third dielectric layers being higher than the dielectric constant of other said dielectric layers;

forming a second mask over fourth dielectric layer, said second mask exposing partial said fourth dielectric layer which is disposed over said fourth metal structure;

removing partial said fourth dielectric layer that are exposed by said second mask;

removing said second mask and partial said third dielectric layers that located on the top surface of said fourth dielectric layer; and forming a plurality of fifth metal structures within said fourth dielectric layer and over both said fourth metal structure and said third metal structures, said fifth metal structures also filling said gaps so let said gaps be totally filled by both said third dielectric layers and said fifth metal structures.

2. The method of claim 1, further comprising the step of planarizing the surface of said first dielectric layer before both said first metal structure and said second metal structure are formed.

3. The method of claim 1, both said first metal structure and said second metal structure being disposed within said first dielectric layer by the application of damascene process.

4. The method of claim 1, further comprising the step of planarizing the surface of said second dielectric layer before both said third metal structures and said fourth metal structure are formed.

5. The method of claim 1, said second dielectric layer being disposed over the surface of said first dielectric layer before both said third metal structures and said fourth metal structure are formed.

6. The method of claim 4, both said third metal structures and said fourth metal structure being disposed within said second dielectric layer by application of damascene process.

7. The method of claim 1, both said first metal structure and said third metal structures being used as the etch stop layer while partially said third dielectric layers are removed.

8. The method of claim 1, said fifth metal structures are formed by the application of damascene process.

9. The method of claim 1, material of said third dielectric layers being chosen from the group consisting of oxide, SiN, SiC, Ta2O5, TiO2, Y2O3, and ferroelectric materials.

10. The method of claim 1, said third dielectric layers also being disposed over the sidewall of partial said fifth metal structures which is disposed over said third metal structures.

11. The method of claim 1, further comprising the step of forming a first liner over both said third metal structures and said first metal structure before said third dielectric layers are formed.

12. The method of claim 11, material of said first liner being chosen from the group consisting of TiN, TaN, and WN.

13. The method of claim 1, further comprising the step of forming a second liner over said third dielectric layers before said fifth metal structures are formed.

14. The method of claim 13, material of said second liner being chosen from the group consisting of TiN, TaN, and WN.

15. A method for forming a metal insulator metal capacitor, comprising:

providing a substrate, said substrate is covered by a first dielectric layer;

forming a first metal structure at the top of the surface within said first dielectric layer;

forming a second dielectric layer and a plurality of third metal structures over said substrate, wherein said third metal structures are horizontal arranged over said first metal structure and disposed at the top of the surface within said second dielectric layer, each said third metal structure being separated from others so let a plurality of gaps be formed and filled by said second dielectric layer;

forming a fourth dielectric layer over said second dielectric layer and said third metal structures;

forming a mask over said fourth dielectric layer, said mask exposing partial said fourth dielectric layer which is disposed over both said gaps and part of said third metal structures that is disposed between said gaps;

removing partial said fourth dielectric layer and partial said second dielectric layer that are exposed by said mask;

removing said mask;

forming a plurality of third dielectric layers over both said third metal structures and said first metal structure, wherein each said gap is partially filled by said third dielectric layers, the dielectric constant of said third dielectric layers being higher than the dielectric constant of other said dielectric layers; and forming a fifth metal structures within said fourth dielectric layer and over said third metal structures, said fifth metal structures also filling said gaps so let said gaps be totally filled by both said third dielectric layers and said fifth metal structures.

* * * * *